US006899762B2

(12) United States Patent
Wenski et al.

(10) Patent No.: US 6,899,762 B2
(45) Date of Patent: May 31, 2005

(54) EPITAXIALLY COATED SEMICONDUCTOR WAFER AND PROCESS FOR PRODUCING IT

(75) Inventors: Guido Wenski, Burghausen (DE); Wolfgang Siebert, Mehring (DE); Klaus Messmann, Burghausen (DE); Gerhard Heier, Burghausen (DE); Thomas Altmann, Burghausen (DE); Martin Fürfanger, San Jose, CA (US)

(73) Assignee: Siltronic AG, Munich (DE)

( * ) Notice: Subject to any disclaimer, the term of this patent is extended or adjusted under 35 U.S.C. 154(b) by 78 days.

(21) Appl. No.: 10/402,171

(22) Filed: Mar. 28, 2003

(65) Prior Publication Data

US 2003/0186028 A1 Oct. 2, 2003

Related U.S. Application Data

(62) Division of application No. 09/617,192, filed on Jul. 14, 2000, now abandoned.

(30) Foreign Application Priority Data

Aug. 13, 1999 (DE) .......................................... 199 38 340

(51) Int. Cl.[7] .............................................. C30B 25/14
(52) U.S. Cl. .............................. 117/89; 117/92; 117/94
(58) Field of Search ................................ 117/89, 92, 94

(56) References Cited

U.S. PATENT DOCUMENTS 3,691,694 A 9/1972 Goetz et al.
6,030,887 A * 2/2000 Desai et al. ................. 438/478

FOREIGN PATENT DOCUMENTS

| DE | 198 33 257 | 9/1999 |
|---|---|---|
| EP | 0 208 315 | 9/1990 |
| EP | 0 684 634 | 11/1995 |
| EP | 0 711 854 | 5/1996 |
| EP | 0 887 152 | 12/1998 |

OTHER PUBLICATIONS

1997 National Technology Roadmap for Semi–conductors (NTRS), Semiconductor Industry Association (SIA), San Jose, Table 20, p. 64–66.
English Derwent Abstract AN 1999–519699 [44] corresp. to DE 198 33 257.
English Derwent Abstract AN 1987–008979 [02] corresp. to EP 0 208 315.
English application text corresp. to 199 05 737.0.

* cited by examiner

Primary Examiner—Felisa Hiteshew
(74) Attorney, Agent, or Firm—Collard & Roe, P.C.

(57) ABSTRACT

A semiconductor wafer with a front surface and a back surface and an epitaxial layer of semiconducting material deposited on the front surface. In the semiconductor wafer, the epitaxial layer has a maximum local flatness value $SFQR_{max}$ of less than or equal to 0.13 $\mu$m and a maximum density of 0.14 scattered light centers per $cm^2$. The front surface of the semiconductor wafer, prior to the deposition of the epitaxial layer, has a surface roughness of 0.05 to 0.29 nm RMS, measured by AFM on a 1 $\mu$m×1 $\mu$m reference area. Furthermore, there is a process for producing the semiconductor wafer. The process includes the following process steps: (a) as a single polishing step, simultaneous polishing of the front surface and of the back surface of the semiconductor wafer between rotating polishing plates while an alkaline polishing slurry is being supplied, the semiconductor wafer lying in a cutout of a carrier whose thickness is dimensioned to be 2 to 20 $\mu$m less than the thickness of the semiconductor wafer after the latter has been polished; (b) simultaneous treatment of the front surface and of the back surface of the semiconductor wafer between rotating polishing plates while a liquid containing at least one polyhydric alcohol having 2 to 6 carbon atoms is being supplied; (c) cleaning and drying of the semiconductor wafer; and (d) deposition of the epitaxial layer on the front surface of the semiconductor wafer produced in accordance with steps (a) to (c).

11 Claims, No Drawings

EPITAXIALLY COATED SEMICONDUCTOR WAFER AND PROCESS FOR PRODUCING IT

CROSS REFERENCE TO RELATED APPLICATIONS

Applicant claim priority under 35 U.S.C. 119 of German Patent Application No. 199 38 340.5 filed Aug. 13, 1999. This Patent application is a division of and Applicants claim priority under 35 U.S.C. 120 of U.S. patent application Ser. No. 09/617,192 filed Jul. 14, 2000 now abandoned.

BACKGROUND OF THE INVENTION

1. Field of the Invention

The present invention relates to a semiconductor wafer with an epitaxial coating on a front surface which has improved flatness and a reduced number of light scattering centers on the epitaxial layer, and to a cost-effective process for producing it. Semiconductor wafers of this type are suitable for use in the semiconductor industry, in particular for the fabrication of electronic components with line widths of less than or equal to 0.13 μm.

2. The Prior Art

A semiconductor wafer which is intended to be suitable in particular for the fabrication of electronic components with line widths of less than or equal to 0.13 μm must have a large number of special properties. A particularly important property is the local flatness of the semiconductor wafer. The modern stepper technology requires optimum local flatness in all partial regions of a surface of the semiconductor wafer. This can be expressed for example as SFQR (site front-surface referenced least squares/range=range of the positive and negative deviation from a front surface defined by minimizing the mean square error for a component area of defined size). The quantity $SFQR_{max}$ specifies the maximum SFQR value for all the component areas on a semiconductor wafer. A generally accepted rule of thumb states that the $SFQR_{max}$ value of a semiconductor wafer must be less than or equal to the possible line width on this wafer for semiconductor components that are to be produced on it. If this value is exceeded, the stepper experiences focusing problems and the component in question is thus lost.

A further important property of semiconductor wafers is the number of light scattering centers (localized light scatterers, LLS) on the surface on which semiconductor components are intended to be produced. When they are present in a certain number and size, LLS can lead to the failure of the components. The final flatness of a semiconductor wafer is generally produced by a polishing process. In order to improve the flatness values of a semiconductor wafer, apparatuses and processes for the simultaneous polishing of front and rear surfaces of the semiconductor wafer have been provided and developed further. An example of this double-side polishing is described in U.S. Pat. No. 3,691,694.

In accordance with an embodiment of double-side polishing which is described in EP 208,315 B1, semiconductor wafers in carriers which are made of metal or a plastics material and have suitably dimensioned cutouts are moved along a path. This path is predetermined by the machine and process parameters between two rotating polishing plates, which are covered with a polishing cloth, in the presence of a polishing slurry and are thus polished. The German Patent Application No. 19,905,737.0 describes a double-side polishing process which leads to semiconductor wafers with improved flatness principally in the edge region. In this case, carriers are used whose thickness is dimensioned in such a way that the final thickness of the wafers after they have been polished is only 2 to 20 μm greater than the thickness of the carriers.

Monocrystalline semiconductor wafers may have a layer of the same crystal orientation grown thereon in a monocrystalline manner. This is a so-called epitaxial or epitaxially grown layer, on which semiconductor components are applied. Thus,for example a silicon wafer with a silicon layer will have certain advantages over semiconductor wafers made of a homogeneous material. Mention may first be made of the so-called latch-up problem, which can occur for example in bipolar CMOS circuits on homogeneous material. This can lead to voltages in the bipolar transistors which may permit charge reversal and effect a short circuit of the components in question. The person skilled in the art is aware that this latch-up problem can be effectively prevented by the use of an epitaxially coated semiconductor wafer. This wafer is made of a heavily doped substrate wafer (low electrical resistance) and a weakly doped epitaxial layer (high resistance). This simultaneously brings about a desirable gettering effect of the substrate and, moreover, reduces the area occupied by the component. Furthermore, in comparison with polished semiconductor wafers, epitaxially coated surfaces have a lower defect density, expressed as LLS. This may be so-called COPs (crystal-originated particles), for example, which generally leads to a higher yield of intact semiconductor components. Furthermore, epitaxial layers have no appreciable oxygen content, which precludes the risk of oxygen precipitates that potentially destroy circuits in regions relevant to components.

According to the prior art, epitaxially coated semiconductor wafers are produced from suitable intermediates by the process sequence of stock-removing polishing—final polishing—cleaning—epitaxy. In this case, depending on the process control, the surface roughness is approximately 0.5 to 3 nm RMS (root mean square) after the stock-removing polishing, measured by the atomic force microscope method (AFM) in a region of 1 μm×1 μm, and approximately 0.05 to 0.2 nm RMS after the final polishing.

Three-stage or four-stage polishing processes in which the roughness is progressively decreased are likewise known. EP 684,634 A2 describes another procedure in which, in the stock-removing polishing step, two different polishing slurries of different granularity are supplied one after the other before the semiconductor wafers are subjected to a final polishing step. Multi-stage polishing processes have the disadvantage that the production costs of the semiconductor wafers rise with each additional step.

EP 711,854 A1 describes a process for producing an epitaxially coated wafer by subjecting a sawn-lapped-etched silicon wafer to stock-removing polishing. In this case a surface roughness of 0.3 to 1.2 nm RMS (AFM, 1 μm×1 μm) is established. In order to reduce the costs, an epitaxial silicon layer is deposited without a smoothing final polishing step being carried out. The epitaxial layer thus produced is comparable in its electrical properties to an epitaxial layer produced conventionally with prior application of a final polishing step. However, there is an increase in light scattering centers on the epitaxially coated surface. This increase is caused by the relatively high starting roughness, and therefore potentially leads to increased failure of components produced on these wafers.

SUMMARY OF THE INVENTION

Therefore, it is an object of the present invention to provide an epitaxially coated semiconductor wafer which is suitable in particular for the fabrication of electronic components with line widths of less than or equal to 0.13 μm and which does not have the above mentioned disadvantages with regard to the number of light scattering centers on the epitaxially coated surface, and which is accessible due to a cost-effective production process. Furthermore, the further properties of the epitaxially coated semiconductor wafer should be at least equal to those of the epitaxially coated semiconductor wafers produced according to the prior art.

The above object is achieved by the present invention which relates to a semiconductor wafer with a front surface and a back surface and an epitaxial layer of semiconducting-material deposited on the front surface, wherein the epitaxial layer has a maximum local flatness value $SFQR_{max}$ of less than or equal to 0.13 µm and a maximum density of 0.14 light scattering centers per cm². The front surface of the semiconductor wafer, prior to the deposition of the epitaxial layer, has a surface roughness of 0.05 to 0.29 nm RMS, measured by AFM on a 1 µm×1 µm reference area.

Furthermore, the present invention relates to a process for producing a semiconductor wafer with a front surface and a back surface and an epitaxial layer of semiconducting material deposited on the front surface, which comprises the following process steps:

(a) as a single polishing step, simultaneous polishing of the front surface and of the back surface of the semiconductor wafer between rotating polishing plates while an alkaline polishing slurry is being supplied, the semiconductor wafer lying in a cutout in a carrier whose thickness is dimensioned to be 2 to 20 µm less than the thickness of the semiconductor wafer after the wafer has been polished;

(b) simultaneous treatment of the front surface and of the back surface of the semiconductor wafer between rotating polishing plates while a liquid containing at least one polyhydric alcohol having 2 to 6 carbon atoms is being supplied;

(c) cleaning and drying of the semiconductor wafer; and (d) deposition of the epitaxial layer on the front surface of the semiconductor wafer produced in accordance with steps (a) to (c).

An essential feature of the invention is that by simultaneously polishing a front surface and a back surface of a semiconductor wafer in a single polishing step, followed by the supply of an aqueous liquid containing at least one polyhydric alcohol having 2 to 6 carbon atoms, a semiconductor wafer with a high degree of flatness and a low degree of roughness is produced. The process takes place without carrying out a cost-intensive final polishing step, which adversely affects the geometry of the semiconductor wafer. This process leads to an epitaxially coated semiconductor wafer with a surface having a very small number of defects.

The starting material used for the process is a semiconductor wafer which has been separated in a known manner from a crystal. For example it has been separated from a single silicon crystal which has been cut to length and undergone a circular grinding and the front and/or back surfaces of which have undergone a surface-grinding step. If desired, the crystal may be provided with one or more orientation features in order to be able to identify the crystal axes, for example a notch and/or a flat. The edge of the semiconductor wafer may likewise be rounded at a suitable point in the process sequence by means of a suitably profiled grinding wheel. Moreover, it is possible for the surface of the semiconductor wafer to be etched after the grinding step.

The end product of the process is a semiconductor wafer which has been epitaxially coated at least on the front surface. This wafer satisfies the requirements imposed on epitaxially coated semiconductor wafers as starting material for semiconductor component processes with line widths of less than or equal to 0.13 µm. Because of the high yields and the omission of the final polishing step, it has advantages in terms of lower production costs over the semiconductor wafers which are produced according to the prior art.

In principle, the process according to the invention can be used to produce a wafer-like body which is composed of a material which can be machined and epitaxially coated by the chemo-mechanical double-side polishing process used. Silicon in monocrystalline form with a crystal orientation (100), (110) or (111), for example crystallized by a Czochralski or float zone refining process, is preferred. In this case, the silicon contains a certain amount of dopant. A distinction is made between dopants from the 3rd main group of the Periodic Table of the Elements, for example boron, which leads to p-type material. Dopants which are elements from the 5th main group of the Periodic Table of Elements, for example phosphorus, arsenic or antimony, lead to n-type material.

Silicon or silicon/germanium is preferred as the material for the epitaxial coating. By virtue of its dopant content, the epitaxial coating of silicon, for example, generally differs in its electrical properties from those of the silicon semiconductor wafer. This fact is useful in the construction of integrated semiconductor components. However, this is not absolutely necessary. Moreover, with regard to the planned use of the epitaxially coated semiconductor wafer according to the invention, it might be desired to grow an epitaxial layer without any dopant content, which is likewise possible without causing any problems. Within the scope of the invention, silicon wafers with an epitaxial coating of silicon are particularly preferred, where the silicon wafer and the epitaxial layer are either both of the p-type or both of the n-type.

The process is particularly suitable for the production of silicon wafers with diameters of, in particular, 200 mm, 300 mm, 400 mm and 450 mm and thicknesses of a few 100 µm to a few cm, preferably 400 µm to 1200 µm. The epitaxially coated semiconductor wafers can either be used directly as a starting material for the production of semiconductor components. Alternatively, these wafers can be supplied for their intended purpose after the application of back-surface seals or further treatment of the back surface by grinding, etching, polishing, etc., in each case according to the prior art. Of course, the invention can be applied not only to the production of wafers made of a homogeneous material but also to the production of semiconductor substrates constructed in a multilayer manner. Examples of multilayer wafers include SOI (silicon-on-insulator) wafers and so-called bonded wafers.

The process is described further using the example of the production of a silicon wafer with an epitaxial coating of silicon on the front surface.

In principle, it is possible for a silicon wafer which has been sawn, for example by means of an annular sawing or wire sawing process, to be subjected directly to the process according to the invention. However, it is desirable and therefore preferred for the sharp, and therefore highly mechanically sensitive edge of the wafer to be rounded with the aid of a suitably profiled grinding wheel. Furthermore, it is possible, in order to improve the geometry and to partially abrade the destroyed crystal layers, to subject the silicon wafer to a mechanical abrasion step, such as lapping or grinding. This is done in order to reduce the amount of material removed in the polishing step. It is preferred for the silicon wafer to be subjected to a surface-grinding step, where either one side is ground or both sides are ground sequentially or both sides are ground simultaneously. In order to remove the damage to the wafer surface and edge which has inevitably been produced in the mechanical process steps and in order to remove any impurities which may be present, an etching step may take place at this point. This etching step may be carried out either as a wet-chemical treatment of the silicon wafer in an alkaline or acidic etching mixture or as a plasma treatment. An acid etching step in a mixture of concentrated aqueous nitric acid and concentrated aqueous hydrofluoric acid according to the description in German Patent No. 158 33 257C1 is preferred.

A particularly preferred starting material for the process sequence according to the invention is semiconductor wafers made of silicon with a diameter of greater than or equal to 200 mm, produced by sawing a single silicon crystal. This is followed by edge rounding, and sequential surface grinding of both sides of the wafer, and removing from 10 µm to 100 µm of silicon per side. Then there is wet-chemical etching in an acidic etching mixture, and removing from 5 µm to 50 µm of silicon per side of the wafer.

Step (a) of the Process Sequence According to the Invention:

A polishing process which is suitable for the production of the epitaxially coated semiconductor wafers according to the invention is described for example in the German Patent Application No. 19,905,737.0. A commercially available double-side polishing machine of suitable size, e.g. a machine of the AC2000 type from Peter Wolters, can be used to carry out this process. The polishing machine essentially comprises a bottom polishing plate which can rotate freely in the horizontal plane and a top polishing place which can rotate freely in the horizontal plane, both of which are covered with a polishing cloth. A continuous supply of an alkaline polishing slurry of suitable chemical composition is present and allows abrasive polishing of semiconductor wafers, in this case silicon wafers, on both sides.

For cost reasons, it is usual to polish a large number of silicon wafers simultaneously. In this case, the silicon wafers are held during polishing on a geometrical path which is determined by machine and process parameters. They are held by means of carriers which have sufficiently dimensioned cutouts for holding the silicon wafers. The carriers are in contact, by way of a toothing, with the polishing machine via a rotating inner pin gear or toothed gear and an outer pin gear or toothed gear which generally rotates in the opposite direction. Thus they are set in rotation between the two polishing plates. It is particularly preferred for from four to six carriers, which each hold at least three silicon wafers arranged at regular intervals on a circular path, to be used simultaneously.

In principle, the carriers may be made for example of metal, a plastics material, fiber-reinforced plastic or plastic-coated metal. Carriers made of steel or of fiber-reinforced plastic are preferred; carriers made of stainless chromium steel are particularly preferred.

The carriers have one or more cutouts, preferably in the shape of a circle, for holding one or more silicon wafers. In order to ensure that the silicon wafer can move freely in the rotating carrier, the diameter of the cutout must be slightly greater than that of the silicon wafers which are to be polished. In order to prevent damage to the edge of the wafer from the inner edge of the cutout in the carrier during polishing, it is expedient for the inner side of the cutouts to be lined with a plastic coating of the same thickness as the carrier, for example made of polyamide, polyethylene, polypropylene or polyvinylidene difluoride. The thickness of the carriers should be dimensioned in such a way that the final thickness of the polished wafers is preferably 2 to 20 µm greater than the thickness of the carriers. The amount of silicon removed by the polishing step is 5 to 100 µm, preferably 10 µm to 50 µm.

In view of the statements made with regard to the relative thicknesses, the polishing step is preferably carried out in the way which is known to the person skilled in the art. Polishing is preferably carried out using a commercially available polyurethane polishing cloth with a hardness of from 40 to 120 (Shore A). Polyurethane cloths with incorporated polyethylene fibers, lying within a hardness range of from 60 to 90 (Shore A), are particularly preferred. When polishing silicon wafers, it is recommended for a polishing slurry with a pH of preferably 9 to 12, particularly preferably 10 to 11, preferably comprising from 1 to 10% by weight, particularly preferably 1 to 5% by weight, of $SiO_2$ in water, to be supplied continuously. There is also the addition of inorganic bases, such as sodium hydroxide and potassium hydroxide, and/or alkaline salts, such as potassium carbonate, and/or organic bases, such as tetramethylammonium hydroxide to be supplied continuously. The polishing pressure is preferably from 0.05 to 0.5 bar, particularly preferably from 0.1 to 0.3 bar.

Step (b) of the Process Sequence According to the Invention:

After the end of the polishing step (a), the highly chemically reactive hydrophobic wafer surface must be passivated. Within the scope of the invention, this is done by supplying an aqueous liquid which contains at least one polyhydric alcohol having 2 to 6 carbon atoms and acts as a stopping agent. The supply of the liquid replaces the supply of the polishing slurry described further above, without the polishing machine being opened. As a result of this, the front surface and the back surface of the semiconductor wafer are treated simultaneously between the rotating polishing plates with this stopping agent, without the reactive surface of the wafer being exposed to atmospheric oxygen in the meantime. In order to reduce friction forces, it has proved to be preferable for the pressure to be reduced in this case to from 0.02 to 0.10 bar, this therefore being preferred. It is possible for water to be momentarily supplied between the supply of polishing and stopping agent.

Suitable polyhydric alcohols having 2 to 6 carbon atoms are commercially available substances which are obtainable in sufficient purity for the production of semiconductor wafers and are water-miscible. It is preferable to use for example, ethylene glycol (1,2-ethanediol), propylene glycols (1,2- and 1,3-propanediol), butylene glycols (1,3- and 1,4-butanediol) and glycerol (1,2,3-propanetriol) in concentrations of from 0.1 to 10% by volume. Propylene glycols and glycerol in concentrations of from 0.3 to 3% by volume are particularly preferred. The stopping agent may additionally contain short-chain monohydric alcohols, such as iso-propanol and n-butanol, in concentrations of from 0.1 to 2% by volume. In addition, it is possible to add small amounts of oligo- and poly-alcohols, for example higher ethylene glycols, polyvinyl alcohols or polyether polyols, and also surfactants. The addition of strongly acidic or strongly alkaline components is not desirable. This is because, in the former case, uncontrolled changes in pH can result in the formation of silicon dioxide particles which lead to scratched wafer surfaces. Also in the latter case, this is not desirable since etching spots may result on the wafer surface.

Step (c) of the Process Sequence According to the Invention:

After the stopping of step (b), the silicon wafers are removed from the polishing machine and subjected to cleaning and drying according to the prior art. The cleaning can be performed either as a batch process with simultaneous cleaning of a large number of wafers in baths or by spraying processes or else as an individual-wafer process. Within the scope of the invention, preference is given to bath cleaning with the simultaneous cleaning of all the wafers from a polishing operation, for example in the sequence of aqueous hydrofluoric acid—ultrapure water—tetramethylammonium hydroxide (TMAH)/hydrogen peroxide ($H_2O_2$)—ultrapure water, megasound assistance in the TMAH/$H_2O_2$ bath for improved particle removal being advantageous. For drying that leaves no spots, apparatuses are commercially available which operate for example according to the spin drying, hot water, Marangoni or HF/ozone principle and are all equally preferred. The double-side-polished wafers thus obtained are dry, hydrophilic and free from spots, scratches and other flaws that are visible under focused light. These wafers have—depending on the polishing conditions and media chosen, a roughness of between 0.05 and 0.29 nm RMS in accordance with AFM measurements (1 μm×1 μm). Measurements on a commercially available geometry-measuring apparatus which operates capacitively or optically, for example, indicate local geometry values $SFQR_{max}$ of less than or equal to 0.13 μm for component areas of 25 mm×25 mm.

Step (d) of the Process Sequence According to the Invention:

The silicon wafers that have been treated in accordance with steps (a) to (c) are then provided with an epitaxial silicon layer at least on the front surface according to standard processes. This is preferably done according to the CVD (chemical vapor deposition) process in which silanes, for example silane, $SiH_4$, dichlorosilane, $SiH_2Cl_2$, or trichlorosilane, $SiHCl_3$, are passed to the wafer surface, where they decompose to form elementary silicon and volatile byproducts at temperatures of between 900° C. and 1250° C. Thus they form an epitaxial layer, that is they form a monocrystalline silicon layer grown in a manner oriented crystallographically on the semiconductor wafer. In this case, the naturally occurring Si isotope mixture is preferably used. However, within the scope of the invention, it is likewise possible to use artificially changed Si isotope mixtures or pure Si isotopes. Silicon layers having a thickness of between 0.3 μm and 10 μm are preferably grown epitaxially. The epitaxial layer may be undoped or doped in a targeted manner, for example with boron, phosphorus arsenic or antimony in order to set the conduction type and the desired conductivity.

After the performance of the epitaxial coating of at least the front surface of the semiconductor wafer, which is particularly preferably composed of silicon, particularly preferably with silicon, a semiconductor wafer according to the invention is present. Thus, this wafer has a hydrophobic surface and can be supplied in this form for further processing for the purpose of producing integrated components. However, it is possible, although not absolutely necessary within the scope of the invention, to hydrophilize the wafer surface in order to provide protection against contamination. That is to coat the wafer surface with a thin oxide layer, for example an oxide layer having a thickness of approximately 1 nm, which is known as "native oxide" to the person skilled in the art. In principle, this can be done in two different ways. The first procedure has the surface of the epitaxially coated semiconductor wafer being treated with an oxidative gas, for example ozone, which can be carried out in the epitaxy chamber itself or in a separate installation. In the second procedure, it is possible to carry out hydrophilization in a bath installation with a bath sequence of the RCA type, followed by drying of the wafers.

After the process sequence (a) to (d) according to the invention has been carried out, semiconductor wafers which have been epitaxially coated at least on the front surface and have a haze-free surface are present. Before they are subjected to further processing for the purpose of producing semiconductor components, they can be supplied to a stage for characterization of their properties. Measurements on a commercially available geometry-measuring apparatus which operates capacitively or optically, for example, indicate local geometry values $SFQR_{max}$ of less than or equal to 0.13 μm for component areas of 25 mm×25 mm. Measurements using an optical surface inspection apparatus of laser-based operation show a maximum density of 0.14 light scattering centers per $cm^2$ of epitaxially coated wafer surface.

If necessary, a laser-marking step for the purpose of identifying the wafer and/or an edge-polishing step may be added at a suitable point in the process sequence. For example this step may be added before or after grinding in the case of laser marking and before, during or after double-side polishing in the case of edge polishing. A series of further process steps which are required for certain products, such as, by way of example, the application of back-surface coatings of polysilicon, silicon dioxide and/or silicon nitride, can likewise be incorporated into the process sequence at the suitable points according to methods which are known to the person skilled in the art. Furthermore, it may also be desirable for the semiconductor wafer to be subjected to batch cleaning or individual-wafer cleaning according to the prior art and before or after individual process steps.

With regard to the further parameters which are customarily used to characterize wafers, many are well known to the person skilled in the art. These include, by way of example, metal contamination of the surface of the wafers and minority charge carrier lifetime and also nanotopological properties. An epitaxially coated semiconductor wafer produced according to the invention has no disadvantages compared with an epitaxially coated semiconductor wafer which is produced according to the prior art which has the application of a final polishing step prior to the deposition of the epitaxial layer.

An epitaxially coated semiconductor wafer produced according to the invention, in particular a silicon wafer with an epitaxial silicon coating, fulfills the requirements for the production of semiconductor components with line widths of less than or equal to 0.13 μm. The process according to the invention has proved to be an optimum solution for the production of epitaxially coated silicon wafers having the features outlined above. The geometry requirements imposed on the starting material are minimal, which reduces the demands imposed on the preliminary processes. The good geometry which is obtained in the step according to the invention is produced even after relatively little material has been removed. By virtue of the enhanced process reliability, together with a reduced risk of fracture, it is produced in very high yields, without cost-intensive steps for local correction of the geometry, for example by plasma etching, being necessary. Also it is completely preserved on the end product according to the invention as a result of the necessity of carrying out a final polishing step being obviated. It is surprising and unexpected that the process sequence according to the invention results in a product which not only has properties superior to those of semiconductor wafers produced according to the prior art, but at the same time has significant advantages over said semiconductor wafers with regard to its production costs as a result of a final polishing step being dispensed with.

DETAILED DESCRIPTION OF PREFERRED EMBODIMENTS

All the examples and comparative examples described below relate to the production of silicon wafers with a diameter of (300±0.2) mm, an oxygen content of $(6\pm1)\cdot10^{17}$ atoms/$cm^3$ and a boron doping which leads to a resistance in the range of from 5 to 20 mΩ·cm, and which have an epitaxial silicon layer on the front surface with a boron doping which leads to a resistance in the range of from 1 to 10 Ω·cm. The single crystals required for this purpose were, using prior art methods, drawn, cut to length, circular-ground and sawn into wafers with a thickness tailored to the end product on a commercially available wire saw. Edge rounding was followed by a surface-grinding step, on a rotary grinding machine, using diamonds with a grain size of 600 mesh, with 30 μm of silicon being removed in succession from both the front and rear surfaces of the wafer. This was followed by an acid etching step using the flow etching process, where 10 μm of silicon was removed from each wafer surface simultaneously as a result of the rotating wafers being immersed in a mixture of 90% by weight of concentrated nitric acid (70% by weight in aqueous solution), 10% by weight of concentrated hydrofluoric acid (50% by weight in aqueous solution) and 0.1% by weight of ammonium lauryl sulfate. The temperature of the etching mixture was set at (20±1)° C. and gaseous nitrogen was passed through.

EXAMPLE 1

300 mm silicon wafers with etched surfaces and a thickness of 815 μm were available for this example. Moreover, five carriers made of stainless chromium steel with a lapped surface and a thickness of 770 μm were available. These carriers each had three circular cutouts arranged at regular intervals on a circular path, lined with polyamide and with an internal diameter of 301 mm. This allowed 15 300-mm silicon wafers to be polished simultaneously on a double-side polishing machine of the AC2000 type from Peter Wolters.

Step (a): the double-side polishing step was carried out using a commercially available polyurethane polishing cloth SUBA500 from Rodel, reinforced with polyethylene fibers and having a hardness of 74 (Shore A), which was stuck onto both the top and bottom polishing plates, and using a polishing slurry of the Levasil 200 type from Bayer with an $SiO_2$ solids content of 3% by weight and a pH set at 10.5 by additions of potassium carbonate and potassium hydroxide, at a contact pressure of 0.15 bar. The polishing took place with the top and bottom polishing plates each at a temperature of 40° C., and led to an abrasion rate of 0.60 μm/min.

Step (b): once a thickness of the polished wafers of 775 μm had been reached, the supply of the polishing agent was ended and, for a period of 3 min, was replaced by the supply of a stopping agent comprising an aqueous solution of 1% by volume of glycerol, 1% by volume of n-butanol and 0.07% by volume of a commercially available surfactant with the trade name Silapur (preparation based on alkylbenzenesulfonic acid and amine ethoxylate; manufacturer ICB), the bottom polishing plate, top polishing plate and carriers being moved further and the pressure being reduced to 0.05 bar.

Step (c): the polished silicon wafers were removed from the polishing machine and cleaned in a batch cleaning installation with the bath sequence of aqueous hydrofluoric acid—ultrapure water—TMAH/$H_2O_2$/megasound—ultrapure water, and dried in a commercially available dryer operating with isopropanol according to the Marangoni principle. The wafers had a surface roughness of 0.24 nm RMS (AFM, 1 μm×1 μm).

Step (d): the cleaned/dried polished silicon wafers were provided with an epitaxially grown silicon layer on the front surface in an epitaxy reactor of the Centura HT308 type from Applied Materials, where $SiHCl_3$ was used as the silicon component and the resistance was set by doping with diborane, $B_2H_6$. At a reactor chamber temperature of 1090° C., a layer having a thickness of 2.8 μm was deposited at a deposition rate of 3 μm/min.

Characterization of the Epitaxially Coated Silicon Wafers

The silicon wafers that had been epitaxially coated with silicon on the front surface were hydrophilized in a bath installation according to the prior art and dried, and were characterized in respect of their defects on the epitaxially coated front surface on a surface inspection apparatus of the SP1 type from KLA-Tencor operating according to the laser principle. For the total number of LLS defects greater than or equal to 0.12 μm, a mean value of 51±20, corresponding to (0.07±0.03) LLS/$cm^2$, resulted in the DWN ("dark field wide") channel. The wafers were subsequently measured in respect of their local geometry on a geometry-measuring apparatus of the AFS type from ADE with 3 mm edge exclusion, operating according to the capacitive principle; a mean value of (0.10±0.01) μm resulted for the $SFQR_{max}$ values (grid 25 mm×25 mm).

COMPARATIVE EXAMPLE 1

The procedure was as described in Example 1, with the exception that, during the stopping step a mixture of 3% by weight of Levasil 200 and 1% by volume of n-butanol in water was used instead of the glycerol-based liquid described. After cleaning and drying, the polished wafers had a roughness of 0.55 nm RMS (AFM, 1 μm×1 μm). After epitaxial coating and hydrophilization, on the front surface a mean value of the LLS defects greater than or equal to 0.12 μm in the DWN channel of 368±124, corresponding to (0.52±0.18) LLS/$cm^2$, and an $SFQR_{max}$ mean value of (0.10±0.01) μm were determined.

COMPARATIVE EXAMPLE 2

The procedure was as described in Comparative Example 1, with the difference that the epitaxial coating was preceded by a final polishing step on the front surface of the wafers according to the prior art. In this case, use was made of a soft polyurethane polishing cloth and an aqueous slurry of the polishing agent type Glanzox 3900 from Fujimi with an $SiO_2$ solids content of 2% by weight and a pH of 10; after removal of 0.5 μm of silicon at a contact pressure of 0.15 bar, the wafers were cleaned according to the RCA method and dried with the aid of a Marangoni dryer. The roughness of the finally polished front surface was 0.09 nm RMS (AFM, 1 μm×1 μm). After epitaxial deposition of silicon on the finally polished front surface, the following measured values were obtained: mean value of number of LLS defects for front surface greater than or equal to 0.12 μm in the DWN channel 78±23, corresponding to (0.11±0.03) LLS/$cm^2$; mean value $SFQR_{max}$ (0.12±0.03) μm.

Further Characterization of the Wafers Produced

The front surfaces, back surfaces and edges of the 300 mm silicon wafers produced according to the example described above and the two comparative examples were characterized in respect of metal contamination of the wafer surface and minority charge carrier lifetime and also nano-topological properties, using the standard methods which are known to the person skilled in the art. No statistically relevant deviations were observed between the individual test groups.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a semiconductor wafer with a front surface and a back surface and an epitaxial layer of a semiconducting material deposited on the front surface, and said process comprising the following process steps:
    (a) as a single polishing step, simultaneous polishing of the front surface and of the back surface of the semiconductor wafer between rotating polishing plates while an alkaline polishing slurry is being supplied, the semiconductor wafer lying in a cutout of a carrier whose thickness is dimensioned to be 2 to 20 μm less than a thickness of the semiconductor wafer after the wafer has been polished;
    (b) simultaneously treating of the front surface and the back surface of the semiconductor wafer between rotating polishing plates while a liquid containing at least one polyhydric alcohol having 2 to 6 carbon atoms is being supplied;

(c) cleaning and drying of the semiconductor wafer; and (d) depositing the epitaxia layer on the front surface of the semiconductor wafer produced in accordance with steps (a) to (c).

2. The process as claimed in claim 1, wherein the semiconductor wafer and the epitaxial layer are composed of silicon.

3. The process as claimed in claim 1, wherein the alkaline polishing slurry supplied in step (a) essentially comprises a suspension of silicon dioxide particles and a base selected from the group consisting of an inorganic base, an organic base and mixtures thereof in water, which has a pH of 9 to 12 and is supplied continuously.

4. The process as claimed in claim 1, wherein the liquid supplied in step (b) contains at least one polyhydric alcohol selected from the group consisting of ethylene glycol, glycerol, propylene glycol and butylene glycol.

5. The process as claimed in claim 4, wherein the liquid supplied in step (b) further contains at least one substance selected from the group consisting of monohydric alcohols, surfactant, and mixtures thereof.

6. The process as claimed in claim 1, wherein the epitaxial layer deposited in step (d) has a thickness of 0.3 $\mu$m to 10 $\mu$m and is deposited at a temperature of between 900° C. and 1250° C.

7. The process as claimed in claim 1, further comprising hydrophilizing the epitaxial layer deposited in step (d) with an oxidizing gas.

8. The process as claimed in claim 1, further comprising hydrophilizing the epitaxial layer deposited in step (d) by wet-chemical means.

9. The process as claimed in claim 1, comprising producing the semiconductor wafer by sawing a semiconductor crystal and subjecting to a grinding step prior to polishing, one or both surfaces of the semiconductor wafer being ground.

10. The process as claimed in claim 9, comprising rounding an edge of the semiconductor wafer before or after the semiconductor wafer is ground.

11. The process as claimed in claim 1, comprising carrying out an etching step with material being removed from each of the two surfaces of the wafer before the semiconductor wafer is polished.

* * * * *